United States Patent
Kim et al.

(10) Patent No.: US 10,109,775 B2
(45) Date of Patent: Oct. 23, 2018

(54) LIGHT EMITTING DEVICES AND LIGHT EMITTING BULBS INCLUDING THE SAME

(71) Applicant: Lumens Co., Ltd., Yongin-si, Gyeonggi-do (KR)

(72) Inventors: Dae Won Kim, Yongin-si (KR); Yong Wook Cho, Yongin-si (KR); Min Pyo Kim, Yongin-si (KR); Jung Hye Park, Yongin-si (KR); Won Kook Son, Yongin-si (KR)

(73) Assignee: LUMENS CO., LTD., Yongin-si, Gyeonggi-do (KR)

( * ) Notice: Subject to any disclaimer, the term of this patent is extended or adjusted under 35 U.S.C. 154(b) by 204 days.

(21) Appl. No.: 15/335,231

(22) Filed: Oct. 26, 2016

(65) Prior Publication Data
US 2017/0336038 A1 Nov. 23, 2017
US 2018/0209597 A9 Jul. 26, 2018

(30) Foreign Application Priority Data

Apr. 19, 2016 (KR) .................. 10-2016-0047607
Apr. 19, 2016 (KR) .................. 10-2016-0047638
May 23, 2016 (KR) .................. 10-2016-0062712

(51) Int. Cl.
| H01J 1/62 | (2006.01) |
| H01L 33/52 | (2010.01) |
| H01L 27/15 | (2006.01) |
| H01L 33/62 | (2010.01) |
| H01L 33/50 | (2010.01) |
| F21K 9/232 | (2016.01) |
| F21V 3/02 | (2006.01) |

(Continued)

(52) U.S. Cl.
CPC .............. *H01L 33/52* (2013.01); *F21K 9/232* (2016.08); *H01L 27/156* (2013.01); *H01L 33/507* (2013.01); *H01L 33/62* (2013.01); *F21K 9/66* (2016.08); *F21V 3/02* (2013.01); *F21Y 2107/00* (2016.08); *F21Y 2115/10* (2016.08); *H01L 2224/16245* (2013.01); *H05K 1/0274* (2013.01); *H05K 1/181* (2013.01); *H05K 2201/0108* (2013.01); *H05K 2201/10106* (2013.01)

(58) Field of Classification Search
USPC ........................................ 313/505, 498, 506
See application file for complete search history.

(56) References Cited

U.S. PATENT DOCUMENTS 7,217,004 B2    5/2007  Park et al.
2006/0238326 A1*  10/2006  Repetto ................. H01L 27/156
                                                                    340/461

* cited by examiner

Primary Examiner — Vip Patel
(74) Attorney, Agent, or Firm — Polsinelli PC

(57) ABSTRACT

Filament type light emitting devices are disclosed. One of the light emitting devices includes a non-conductive transparent substrate, one or more light emitting diode chips arrayed above the upper surface of the non-conductive transparent substrate and each including input and output ends extending toward the non-conductive transparent substrate, and conductive transparent connection portions formed on the upper surface of the non-conductive transparent substrate and electrically connected to the input and output ends. Light transmitting regions are provided without reflectors in the vicinity of the input and output ends between the non-conductive transparent substrate and the light emitting diode chips. Thus, light is emitted backward from the light emitting diode chips through the light transmitting regions and the non-conductive transparent substrate.

20 Claims, 12 Drawing Sheets

(51) Int. Cl.
*H05K 1/02* (2006.01)
*H05K 1/18* (2006.01)
*F21Y 115/10* (2016.01)
*F21Y 107/00* (2016.01)
*F21K 9/66* (2016.01)

LIGHT EMITTING DEVICES AND LIGHT EMITTING BULBS INCLUDING THE SAME

CROSS-REFERENCE TO RELATED APPLICATIONS

The present application claims priority under 35 U.S.C. § 119(a) to Korean Patent Application No. 10-2016-0047607 filed in the Republic of Korea on Apr. 19, 2016, Korean Patent Application No. 10-2016-0047638 filed in the Republic of Korea on Apr. 19, 2016, and Korean Patent Application No. 10-2016-0062712 filed in the Republic of Korea on May 23, 2016, all of which are hereby incorporated by reference in their entireties.

BACKGROUND

Field of the Disclosure

The present invention relates to filament type light emitting devices and light emitting bulbs including the same.

Discussion of the Related Art

Light emitting bulbs have been developed in which a plurality of filament type light emitting devices are placed in a light transmitting globe. Each of the light emitting devices includes an elongated package and a plurality of light emitting diode chips mounted on the package. For both forward and backward light emission, light emitting devices arranged such that light is emitted forward may be connected in series to light emitting devices arranged such that light is emitted backward.

However, since each of the light emitting devices emits light in only one direction, an increased number of the light emitting devices are required to distribute light at desired angles.

An existing flip-chip type light emitting diode chip includes a sapphire substrate formed on the epilayers and input and output ends formed under the epilayers. Each of the input and output ends includes an electrode pad and a solder bump. The underside of the epilayers is covered with a reflective layer from which light is reflected upward. The reflective layer makes it difficult to apply the flip-chip type light emitting diode chip to a filament type light emitting device where backward light emission is required.

SUMMARY

One object of the present invention is to provide a light emitting devices including a structure capable of emitting light forward and backward from flip-chip type light emitting diode chips.

Another object of the present invention is to provide light emitting bulbs that use light emitting devices including a structure capable of emitting light forward and backward from flip-chip type light emitting diode chips, achieving light distribution at much wider angles.

According to one aspect of the present invention, a light emitting device includes a non-conductive transparent substrate, one or more light emitting diode chips mounted above the upper surface of the non-conductive transparent substrate and each including input and output ends extending toward the non-conductive transparent substrate, and conductive transparent connection portions formed on the upper surface of the non-conductive transparent substrate and electrically connected to the input and output ends wherein light transmitting regions are provided in the vicinity of the input and output ends between the non-conductive transparent substrate and the light emitting diode chips and light is emitted backward from the light emitting diode chips through the light transmitting regions and the non-conductive transparent substrate.

According to a further aspect of the present invention, a light emitting device includes an elongated non-conductive transparent substrate, an input terminal arranged on one side of the non-conductive transparent substrate, an output terminal arranged on the other side of the non-conductive transparent substrate, n light emitting diode chips arrayed above the non-conductive transparent substrate and each having input and output ends, and connection means formed on the non-conductive transparent substrate to connect the n light emitting diode chips in series wherein the connection means includes a first connection portion that connects the input terminal to the input end of the first light emitting diode chip and is made of a conductive transparent material.

According to another aspect of the present invention, a light emitting device includes an elongated first substrate, an elongated second substrate spaced apart from and parallel to the first substrate, connection means provided between the first substrate and the second substrate and made of a conductive material, and n light emitting diode chips mounted above both the first substrate and the second substrate and electrically interconnected through input and output ends connected to the connection means wherein gaps are formed between the first substrate and the second substrate to allow light from the n light emitting diode chips to pass therethrough.

The light emitting devices of the present invention are characterized by a structure in which light is transmitted backward through the bottoms of flip-chip type light emitting diode chips, each of which has input and output ends, and a substrate connected to the input and output ends. Due to this structure, the light emitting devices can emit a large amount of light in both forward and backward directions. The light emitting devices are advantageous for use in light emitting bulbs.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Preferred embodiments of the present invention will now be described with reference to the accompanying drawings.

Figure 1:
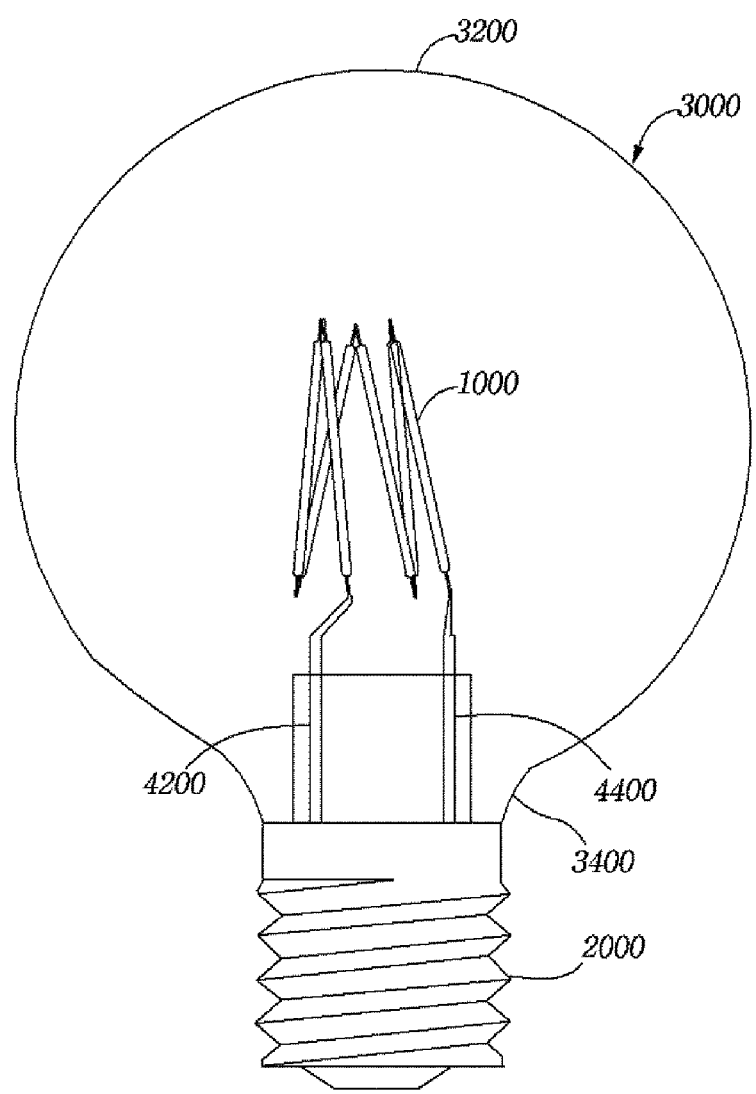
FIG. 1 is a view for explaining a general light emitting bulb.

FIG. 1 is a view for explaining a general light emitting bulb.

Referring to FIG. 1, the light emitting bulb includes a base 2000, a light transmitting globe 3000 coupled to a front opening of the base 2000, leads 4200 and 4400 for power supply provided in the base 2000 and extending to a space defined by the light transmitting globe 3000, and a plurality of light emitting devices 1000 arranged inside the light transmitting globe 3000 and receiving power through the leads 4200 and 4400 to emit light.

The base 2000 is removably fitted into a socket for power supply and includes electrodes electrically connected to the socket. For connection to the socket, the base 2000 has an externally threaded portion screwed into an internally threaded portion of the socket.

The light transmitting globe 3000 is divided into front and rear regions based on the location of the light emitting devices 1000. The front and rear regions of the light transmitting globe 3000 are made of the same transparent material, taking into consideration the characteristics of the light emitting devices 1000 that can emit light not only in the backward direction but also in the forward direction, which will be explained below. The light transmitting globe 3000 includes a spherically shaped portion 3200 and a neck portion 3400 integrated with the spherically shaped portion 3200 at the rear of the spherically shaped portion 3200 and coupled to the base.

Figure 2:
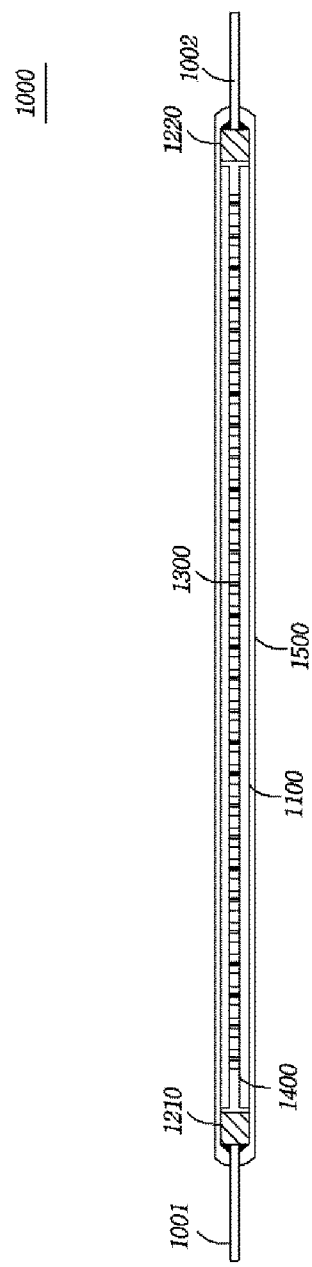
FIG. 2 is a plan cross-sectional view for explaining a filament type light emitting device for a light emitting bulb according to a first embodiment of the present invention.
Figure 3:
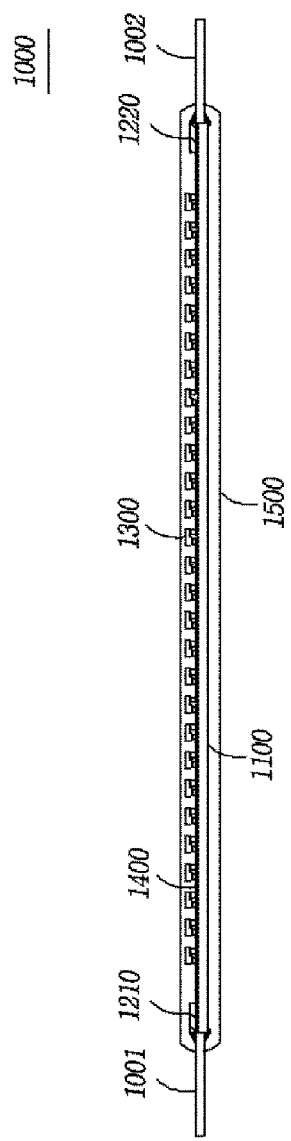
FIG. 3 is a side cross-sectional view illustrating the filament type light emitting device of FIG. 2.
Figure 4:
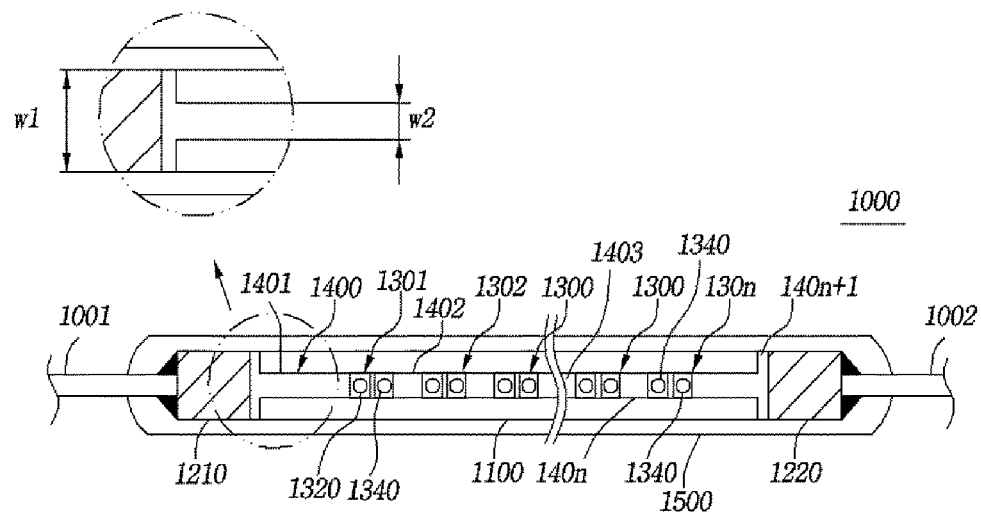
FIG. 4 is an enlarged plan cross-sectional view of the filament type light emitting device according to the first embodiment of the present invention.
Figure 5:
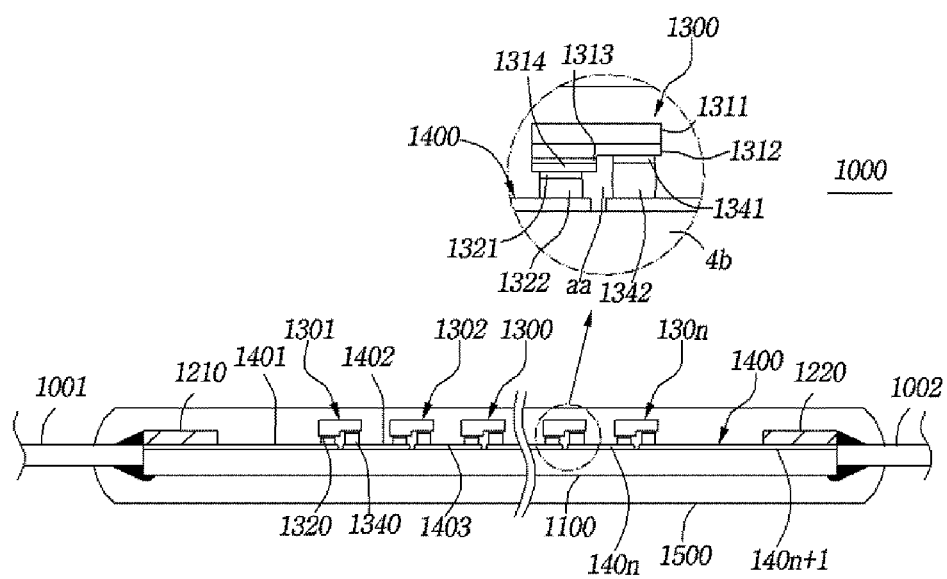
FIG. 5 is an enlarged side cross-sectional view of the filament type light emitting device according to the first embodiment of the present invention.

The leads 4200 and 4400 stand upright in the base 2000 and extend to a space defined by the light transmitting globe 3000. The leads 4200 and 4400 function to supply power to the light emitting devices 1000 and firmly support the light emitting devices 1000. The functions of the leads will be explained in more detail. The light emitting devices 1000 are arranged at angles with respect to each other and are connected in series. One of the leads 4200 and 4400 is connected to a lead terminal provided at the power input side of the first light emitting device of the light emitting devices 1000 arranged in series and the other lead 4400 is connected to a lead terminal provided at the power output side of the last light emitting device 1000 of the light emitting devices 1000 arranged in series. The light emitting devices 1000 have sufficient stiffness to maintain their original shape. The light emitting devices 1000 are interconnected and connected to the leads 4200 and 4400 through outwardly extending terminals 1001 and 1002 protruding from both sides thereof (see FIGS. 2 and 5). With this arrangement, the light emitting devices 1000 can receive power.

First Embodiment

FIGS. 2 to 5 illustrate a light emitting device according to a first embodiment of the present invention.

Referring to FIGS. 2 to 5, the light emitting device 1000 includes an elongated non-conductive transparent substrate 1100, an input terminal 1210 arranged on one side of the non-conductive transparent substrate 1100, an output terminal 1220 arranged on the other side of the non-conductive transparent substrate 1100, n light emitting diode chips 1300 arrayed above the non-conductive transparent substrate 1100 and each having an input end 1320 and an output end 1340, and connection means 1400 formed on the non-conductive transparent substrate 1100 to connect the n light emitting diode chips 1300 in series. The light emitting device 1000 may further include an elongated light transmitting encapsulant 1500 that covers the light emitting diode chips 1300 and the non-conductive transparent substrate 1100 above which the light emitting diode chips 1300 are mounted, while allowing exposure of outwardly extending terminals 1001 and 1002 protruding from both sides of the non-conductive transparent substrate. The light transmitting encapsulant 1500 may be formed by molding a transparent resin and may include a wavelength conversion material, for example, a fluorescent material, that acts in concert with at least some of the light emitting diode chips 1300, particularly blue light emitting diode chips, to produce white light.

The connection means 1400 formed on the non-conductive transparent substrate 1100 is transparent and conductive. The connection means 1400 includes a first conductive transparent connection portion 1401 connecting the input terminal 1210 to the input end 1320 of the first light emitting diode chip 1301, a second conductive transparent connection portion 1402 spaced apart from the first conductive transparent connection portion 1401 and connecting the output end 1340 of the first light emitting diode chip 1301 to the input end 1320 of the second light emitting diode chip 1302, an $(n+1)^{th}$ conductive transparent connection portion $140n+1$ connecting the output terminal 1220 to the output end 1340 of the $n^{th}$ light emitting diode chip $130n$, and an $n^{th}$ conductive transparent connection portion $140n$ spaced apart from the $(n+1)^{th}$ conductive transparent connection portion $140n+1$ and connected to the input end 1320 of the $n^{th}$ light emitting diode chip $130n$. The connection means 1400 includes intermediate conductive transparent connection portions 1403, . . . , each of which connects the two adjacent light emitting diode chips 1300.

As previously mentioned, all conductive transparent connection portions, including the first, second, $n^{th}$, and $(n+1)^{th}$ conductive connection portions, are spaced apart from each other and are in the form of conductive transparent thin films, which will be explained in more detail below.

The non-conductive transparent substrate 1100 has flat upper and lower surfaces and is elongated in the lengthwise direction thereof. The non-conductive transparent substrate 1100 is made of a non-conductive transparent material, such as transparent plastic, glass or quartz. The input terminal 1210 is formed on one side of the upper surface of the non-conductive transparent substrate 1100, more specifically, on the upper surface of one end of the non-conductive transparent substrate 1100, and is made of a conductive metal material. The input terminal output terminal 1220 is formed on the other side of the upper surface of the non-conductive transparent substrate 1100, more specifically, on the upper surface of the other end of the non-conductive transparent substrate 1100, and is made of a conductive metal material. The input terminal 1210 and the output terminal 1220 are connected to the outwardly extending terminals 1001 and 1002 protruding outward from the non-conductive transparent substrate 1100, respectively. The outwardly extending terminals 1001 and 1002 are connected to the leads 4200 and 4400 (see FIG. 1), respectively.

Before formation of the input terminal 1210 and the output terminal 1220, the connection means 1400 is provided on the upper surface of the non-conductive transparent substrate 1100. The connection means 1400 is formed by patterning a conductive transparent film. For example, the connection means 1400 may be formed by forming a conductive transparent film over the entire upper surface of the non-conductive transparent substrate 1100 and etching the conductive transparent film through a mask. Alternatively, the connection means 1400 may be formed by arranging a patterned mask on the non-conductive transparent substrate 1100 and forming a conductive transparent film on the mask. The conductive transparent film may be a metal oxide film for a transparent electrode, such as an indium tin oxide (ITO) film, but is preferably made of a metal material including at least one of Ni, Au, Pt, Pd, and W. The metal material is formed to a thickness of 10 μm or less on the non-conductive transparent substrate.

The n light emitting diode chips 1300 are arrayed in a line above the upper surface of the non-conductive transparent substrate 1100 between the input terminal 1210 and the output terminal 1220. The input end 1320 and the output end 1340 of each of the n light emitting diode chips 1300 include electrode pads 1321 and 1341 and/or bumps 1322 and 1342, respectively, that extend toward the non-conductive transparent substrate 1100.

The n light emitting diode chips 1300 are flip-chip type light emitting diode chips and are mounted above the non-conductive transparent substrate 1100 by flip-chip bonding. As a result of the mounting, the n light emitting diode chips 1300 are connected to the corresponding conductive transparent connection portions of the connection means 1400 formed using a conductive transparent film on the non-conductive transparent substrate 1100 such that they are connected in series to form a circuit. In this embodiment, the conductive transparent connection portions 1401, 1402, 1403, . . . , 140n, and 140n+1 connect the input terminal to the first light emitting diode chip, connect the output terminal to the last light emitting diode chip, and the adjacent intermediate light emitting diode chips to each other. This connection eliminates the need for the use of bonding wires, unlike series circuit connection of conventional lateral type light emitting diode chips.

Only a vacant light transmitting region aa exists except the input end 1320 and the output end 1340 between the lower surface of each of the light emitting diode chips 1300 and the upper surface of the non-conductive transparent substrate 1100. Thus, despite their flip-chip type, the light emitting diode chips 1300 can emit light even in the backward direction without the need to provide additional reflectors in the direction toward the non-conductive transparent substrate 1100. More specifically, the light emitting diode chips 1300 can emit light not only in the forward direction without loss but also in the backward direction through the non-conductive transparent substrate 1100. For example, 30% of the total amount of light from the light emitting diode chips 1300 is emitted in the forward direction where a sapphire substrate is placed and 70% of the total amount of light is emitted in the backward direction through the non-conductive transparent substrate 1100.

In this embodiment, each of the n light emitting diode chips 1300 includes a light transmitting substrate 1311, a first conductivity type semiconductor layer 1312, an active layer 1313, and a second conductivity type semiconductor layer 1314 in this order from top to bottom. A portion of the second conductivity type semiconductor layer 1314 is connected to the first electrode pad 1321. A portion of the first conductivity type semiconductor layer 1312 is opened by mesa etching and is connected to the second electrode pad 1341.

The light transmitting substrate 1311 is used for the growth of the first conductivity type semiconductor layer 1312, the active layer 1313, and the second conductivity type semiconductor layer 1314. The first conductivity type semiconductor may be a gallium nitride-based layer. More preferably, the light transmitting substrate 1311 is a transparent sapphire substrate. The first conductivity type semiconductor layer 1312 and the second conductivity type semiconductor layer 1314 may be an n-type semiconductor layer and a p-type semiconductor layer, respectively. The active layer 1313 may include multi-quantum wells.

The first electrode pad 1321 and the second electrode pad 1341 are connected to the conductive transparent connection portion 1401, 1401, 1402, 1403, . . . , 140n or 140n+1 on the non-conductive transparent substrate 1100 through the first bump 1322 and the second bump 1342, respectively.

It is preferred that the input terminal 1210 includes a metal base material 1211 including at least one of Ag, Au, Cu, and Al and a reflective material film coated on the metal base material. Likewise, it is preferred that the output terminal 1220 includes a metal base material including at least one of Ag, Au, Cu, and Al and a reflective material film coated on the metal base material.

The light emitting device 1000 is fabricated by the following procedure. First, the non-conductive transparent substrate 1100 is prepared. A metal material including Ni, Au, Pt, Pd or W or a metal oxide, such as ITO, is deposited to a thickness of 10 μm or less on the non-conductive transparent substrate 1100 to form a conductive transparent film. Then, the conductive transparent film is etched to form the connection means 1400 including conductive transparent connection portions 1401, 1402, 1403, . . . , 140n, and 140n+1 on the non-conductive transparent substrate 1100. Alternatively, the connection means 1400 including conductive transparent connection portions 1401, 1402, 1403, . . . , 140n, and 140n+1 may be formed by forming a patterned mask on the non-conductive transparent substrate 1100 and microdepositing a transparent metal oxide or a metal thereon. An E-beam or sputtering process may be used for the formation of the connection means 1400.

Next, the input terminal 1210 and the output terminal 1220 are arranged on the non-conductive transparent substrate 1100 such that they are electrically connected in series with the light emitting diode chips 1300 through the conductive transparent connection portions 1401, 1402, 1403, . . . , 140n, and 140n+1. With this arrangement, the input terminal 1210 is connected to the input end 1320 of the first light emitting diode chip 1301 through the first conductive transparent connection portion 1401, the output end 1340 of the first light emitting diode chip 1301 is connected to the input end 1320 of the second light emitting diode chip 1302 through the second conductive transparent connection portion 1402, the output terminal 1220 is connected to the output end 1340 of the $n^{th}$ light emitting diode chip 130$n$ through the $(n+1)^{th}$ conductive transparent connection portion 140$n$+1, and the $n^{th}$ conductive transparent connection portion 140$n$ is connected to the input end 1320 of the $n^{th}$ light emitting diode chip 130$n$. In addition, the other adjacent light emitting diode chips 1300 are connected to each other through the corresponding conductive transparent connection portions.

The first conductive transparent connection portion 1401 includes a portion adapted to the input terminal 1210 and having a first width w1 and a portion adapted to the input end of the first light emitting diode chip 1301 and having a second width w2. The $(n+1)^{th}$ conductive transparent connection portion 140$n$+1 includes a portion adapted to the output terminal 1220 and having a first width w1 and a portion adapted to the output end of the $n^{th}$ light emitting diode chip 130$n$ and having a second width w2. The other conductive transparent connection portions between the first conductive transparent connection portion 1401 and the $(n+1)^{th}$ conductive transparent connection portion 140$n$+1 have the second width w2. The first width w1 is determined to be larger than the second width w2.

The two outwardly extending terminals 1001 and 1002 are connected to the input terminal 1210 and the output terminal 1220, respectively, and protrude from both sides of the non-conductive transparent substrate. The light transmitting encapsulant 1500 is formed to surround the non-conductive transparent substrate 1100 and the light emitting diode chips 1300 by molding, completing the fabrication of the light emitting device 1000. Only the two outwardly extending terminals 1001 and 1002 are uncovered by the light transmitting encapsulant 1500 and are exposed to the outside. The light transmitting encapsulant 1500 may include a wavelength conversion material, i.e. a fluorescent material, capable of producing white light in concert with the diode chips 1300 emitting light at blue or ultraviolet wavelengths. At least one light emitting diode chip capable of emitting light in the wavelength range of 620-680 nm may be included in the light emitting diode chips 1300 to convert white light to warm white light.

Second Embodiment

Figure 6:
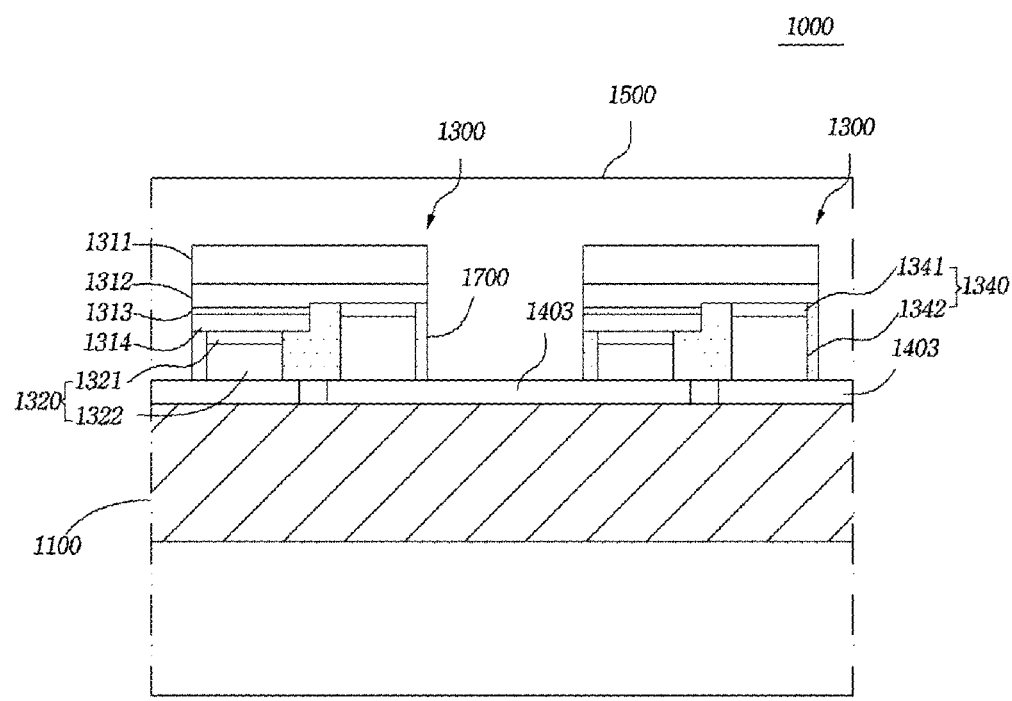
FIG. 6 is a partial side cross-sectional view of a filament type light emitting device according to a second embodiment of the present invention.

FIG. 6 is a partially exploded cross-sectional view of a filament type light emitting device according to a second embodiment of the present invention.

Referring to FIG. 6, the light emitting device 1000 includes a non-conductive transparent substrate 1100 and a plurality of flip-chip type light emitting diode chips 1300 mounted in a linear array above the non-conductive transparent substrate 1100, as in the previous embodiment. The light emitting device 1000 includes conductive transparent connection portions 1403 as connection means formed on the non-conductive transparent substrate 1100. The conductive transparent connection portions 1403 connect the adjacent flip-chip type light emitting diode chips 1300 to each other and connect one of the light emitting diode chips 1300 to an input terminal and/or an output terminal (not illustrated). The conductive transparent connection portions 1403 may be metal oxide films for transparent electrodes, such as ITO films, or transparent metal films formed by deposition to a thickness of 10 μm or less.

As in the previous embodiment, each of the flip-chip type light emitting diode chips 1300 includes a light transmitting substrate 1311, a first conductivity type semiconductor layer 1312, an active layer 1313, and a second conductivity type semiconductor layer 1314 in this order from top to bottom. A portion of the second conductivity type semiconductor layer 1314 is connected to a first electrode pad 1321. A portion of the first conductivity type semiconductor layer 1312 is opened by mesa etching and is connected to a second electrode pad 1341.

The first electrode pad 1321 and the second electrode pad 1341 are connected to the corresponding conductive transparent connection portions on the non-conductive transparent substrate 1100 through a first bump 1322 and a second bump 1342, respectively. The first bump 1322 and the first electrode pad 1321 of the flip-chip type light emitting diode chip 1300 constitute an input end 1320 and the second bump 1342 and the second electrode pad 1341 of the flip-chip type light emitting diode chip 1300 constitute an output end 1340. It is noted that the input end and the output end may also be interchanged.

In the light emitting device according to the previous embodiment, vacant light transmitting regions are formed without reflectors between the flip-chip type light emitting diode chips and the non-conductive transparent substrate. In contrast, in the light emitting device 1000 according to this embodiment, vacant spaces are formed between the upper surface of the non-conductive transparent substrate 1100, on which the conductive transparent connection portions 1403 are intermittently spaced apart from each other, and the lower surfaces of the flip-chip type light emitting diode chips 1300, each of which is formed with the input end 1320 and the output end 1340, and are filled with an insulating transparent material 1700 to form light transmitting regions. The insulating transparent material 1700 may be, for example, a transparent resin. The insulating transparent material 1700 may include a wavelength conversion material, e.g., a fluorescent material. The light emitting device 1000 includes a light transmitting encapsulant 1500 in the form of a transparent molding material or a transparent tube. The light transmitting encapsulant 1500 encapsulates the flip-chip type light emitting diode chips 1300 mounted above the non-conductive transparent substrate 1100 such that the non-conductive transparent substrate 1100, on which the conductive transparent connection portions 1403 are formed, is electrically connected to the flip-chip type light emitting diode chips 1300 through the conductive transparent connection portions 1403. At least some of the flip-chip type light emitting diode chips 1300 are diode chips emitting light in the blue or ultraviolet wavelength band, which produce white light together with the fluorescent material included in the insulating transparent material 1700 and/or the light transmitting encapsulant 1500. One or more of the light emitting diode chips 1300 may be diode chips that emit light in the wavelength range of 620 to 680 nm, contributing to warm white light emission.

Third Embodiment

Figure 7:
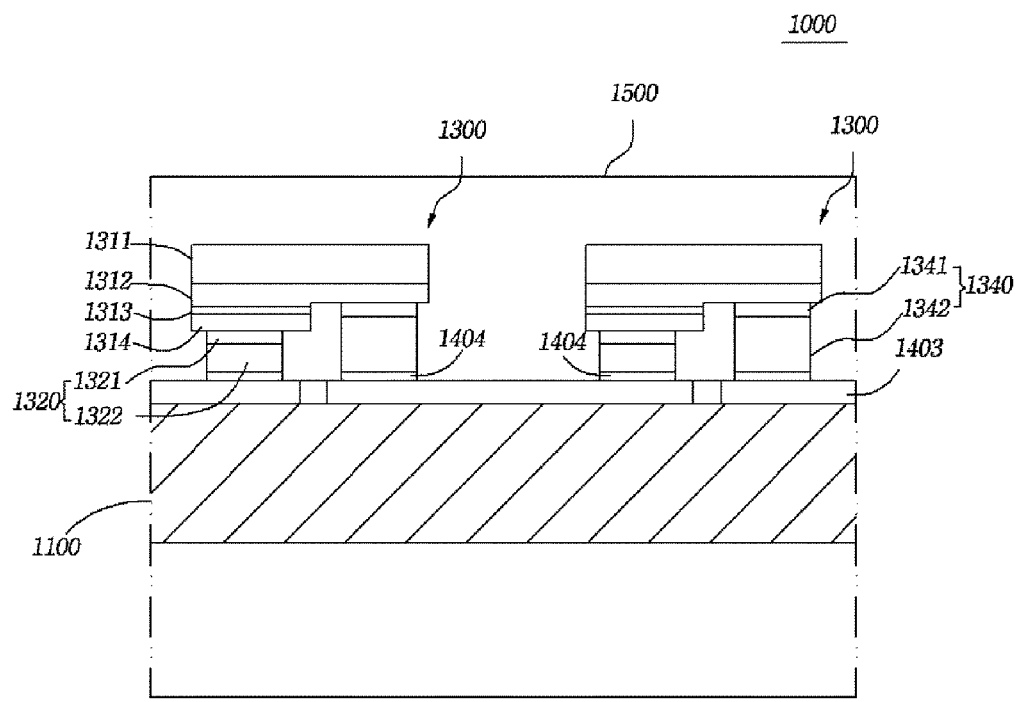
FIG. 7 is a partial side cross-sectional view of a filament type light emitting device according to a third embodiment of the present invention.

FIG. 7 is a partial side cross-sectional view of a filament type light emitting device according to a third embodiment of the present invention.

Referring to FIG. 7, the filament type light emitting device 1000 includes a plurality of conductive transparent connection portions 1403 made of ITO (hereinafter referred to as "ITO transparent connection portions"). In order to increase the adhesion between each of the ITO transparent connection portions 1403 and a bump 1322 of an input end 1320 or a bump 1342 of an output end 1340, an opaque metal electrode layer 1404 is further formed between the ITO transparent connection portion 1403 and the bump 1322 of the input end 1320 or the bump 1422 of the output end 1340 such that it is placed in direct contact with the corresponding bump 1322 or 1422 on the ITO transparent connection portion 1403. The other elements are the same as or similar to those in the previous embodiments and their detailed explanation is omitted.

Fourth Embodiment

Figure 8:
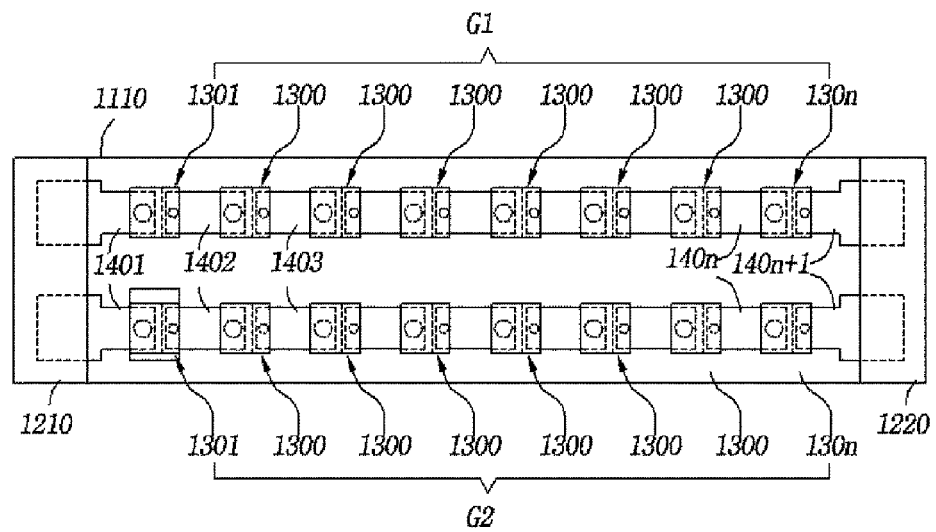
FIG. 8 is a view for explaining a filament type light emitting device according to a fourth embodiment of the present invention.

FIG. 8 illustrates a filament type light emitting device according to a fourth embodiment of the present invention.

Referring to FIG. 8, the filament type light emitting device includes a plurality of light emitting groups G1 and G2, each of which includes n light emitting diode chips 1300 connected in series on a non-conductive transparent substrate 1100. The light emitting groups G1 and G2 are connected in parallel.

In each of the light emitting groups G1 and G2, the n light emitting diode chips 1300 are connected in series through connection means including conductive transparent connection portions 1401, 1402, 1403, . . . , 140n, and 140n1 between an input terminal 1210 and an output terminal 1220. The first light emitting diode chip 1301 positioned adjacent to the input terminal 1210 and/or the $n^{th}$ light emitting diode chip 130n positioned adjacent to the output terminal 1220 are preferably diode chips that emit red light at wavelengths of 620 to 680 nm. The other light emitting diode chips 1300 are preferably diode chips that emit light at blue or ultraviolet wavelengths, which produce white light together with a fluorescent material.

Fifth Embodiment

Figure 9:
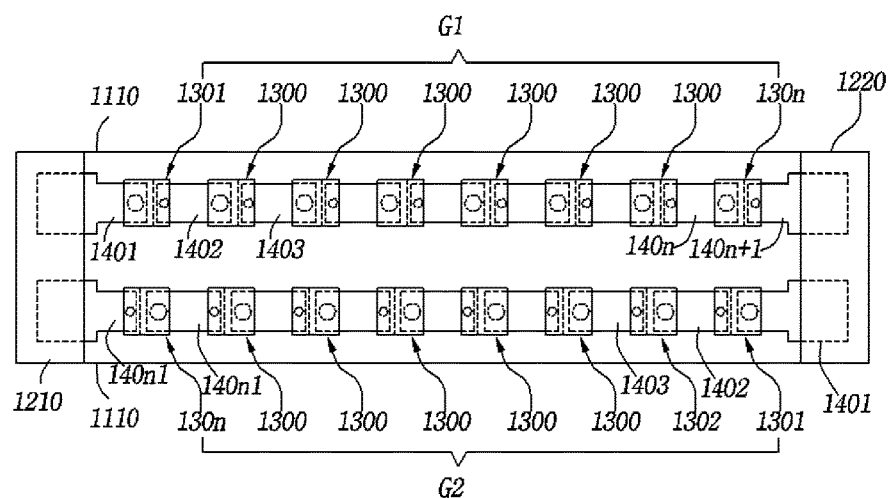
FIG. 9 is a view for explaining a filament type light emitting device according to a fifth embodiment of the present invention.
Figure 10:
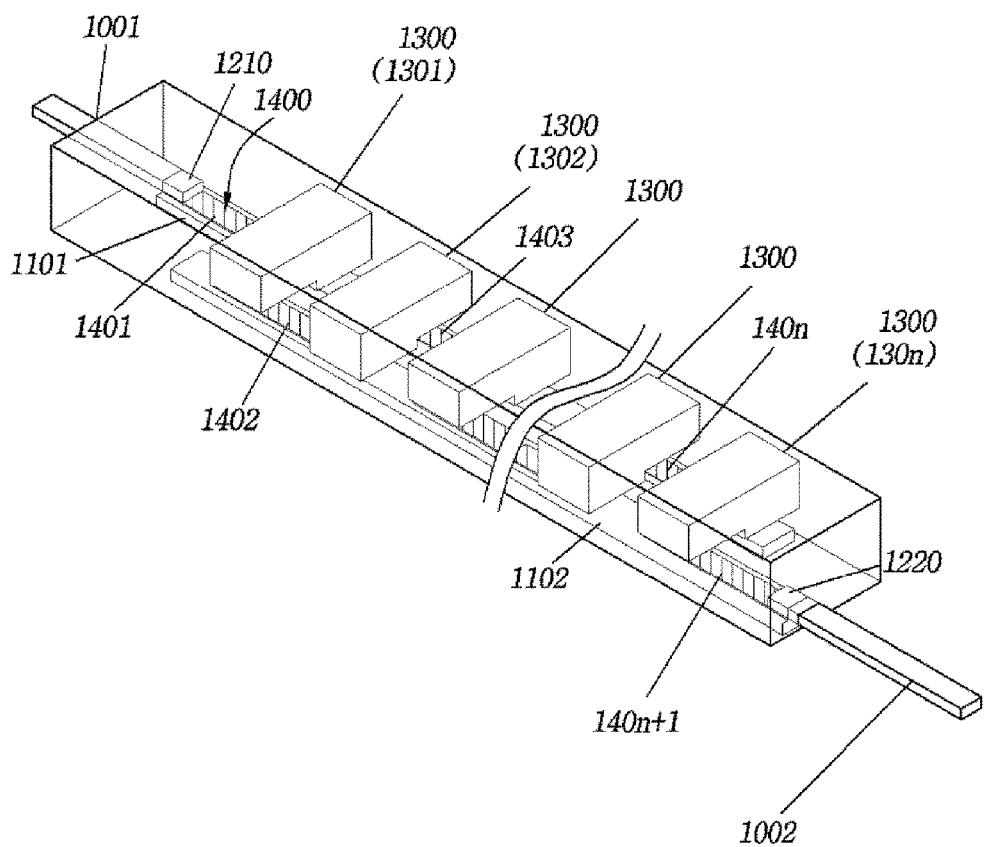
FIG. 10 is a perspective view illustrating a light emitting device according to a sixth embodiment of the present invention.
Figure 11:
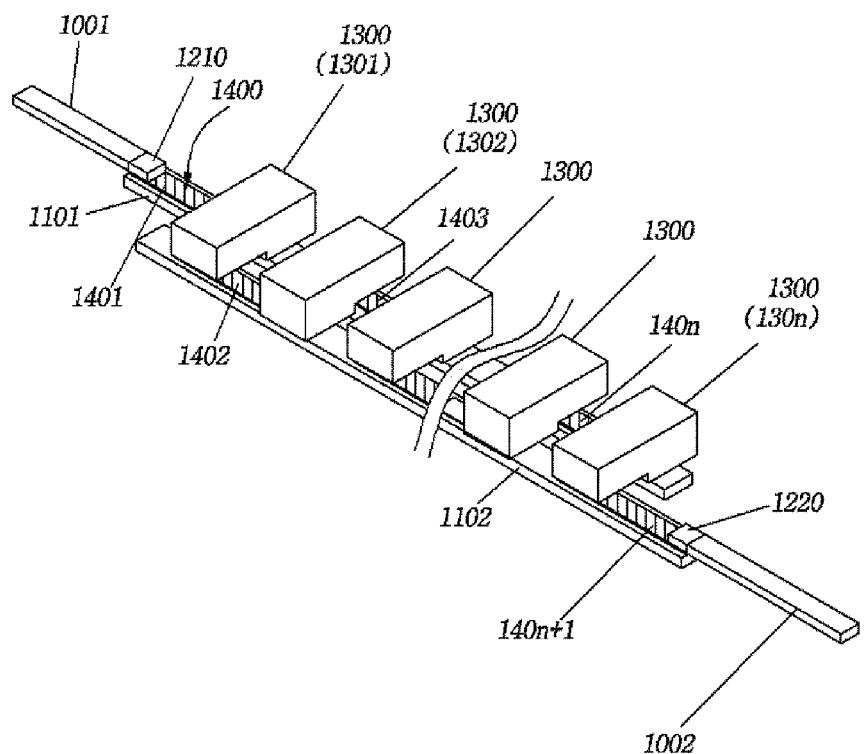
FIG. 11 is a perspective view illustrating a state in which an encapsulant is removed from the light emitting device according to the sixth embodiment of the present invention.
Figure 12:
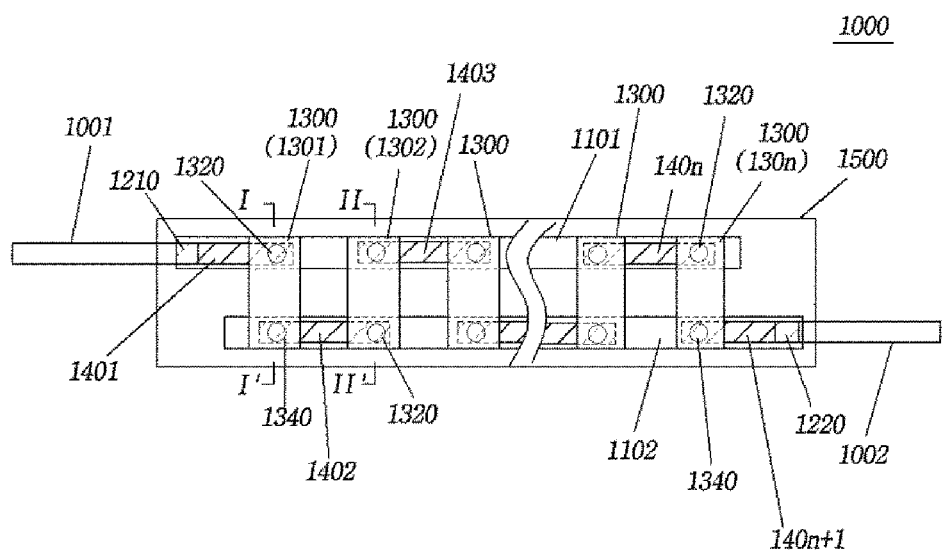
FIG. 12 is a plan view illustrating the light emitting device according to the sixth embodiment of the present invention.
Figure 13:
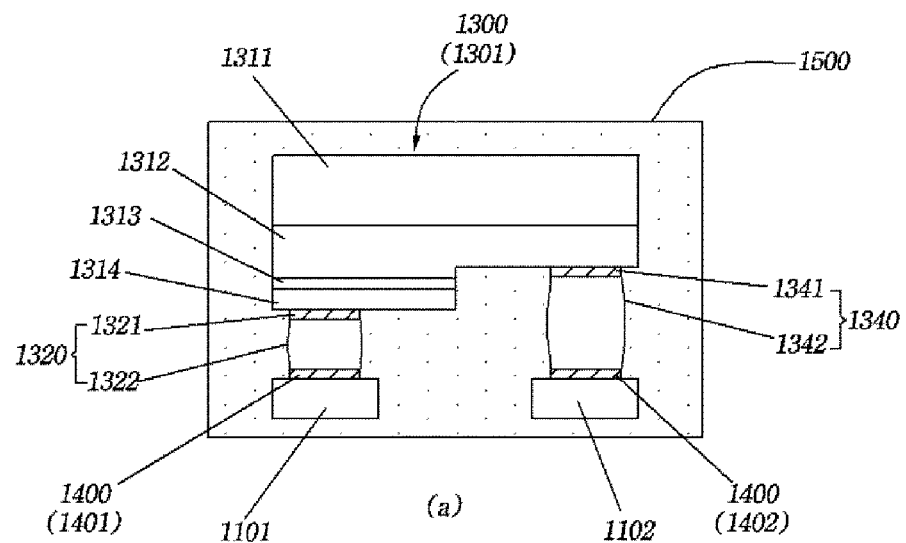
FIG. 13 illustrates cross-sectional views taken along lines (a) I-I' and (b) II-II' of FIG. 12.
Figure 13:
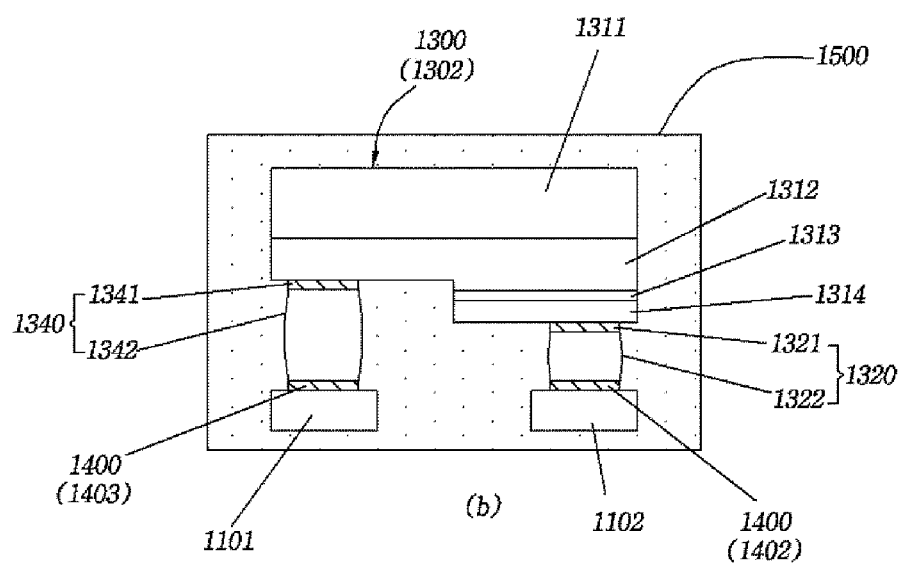

FIG. 9 illustrates a filament type light emitting device according to a fifth embodiment of the present invention.

Referring to FIG. 9, the filament type light emitting device includes a plurality of light emitting groups G1 and G2, each of which includes n light emitting diode chips 1300 connected in series on a non-conductive transparent substrate 1100. The light emitting groups G1 and G2 are connected in antiparallel. In each of the light emitting groups G1 and G2, the n light emitting diode chips 1300 are connected in series through connection means including conductive transparent connection portions 1401, 1402, 1403, . . . , 140n, and 140n1 between an input terminal 1210 and an output terminal 1220, as explained in the previous embodiment. The element 1210 acting as the input terminal in the first light emitting group G1 becomes an output terminal in the second light emitting group G2. The element 1220 acting as the output terminal in the first light emitting group G1 becomes an input terminal in the second light emitting group G2. Although not illustrated, two or more of the connection portions may be connected to an input or output end of the diode chip emitting light at wavelengths of 620 to 680 nm.

Sixth Embodiment

FIGS. 10 to 13 are views for explaining a light emitting device according to a sixth embodiment of the present invention.

Referring to FIGS. 10 to 13, the light emitting device 1000 includes a first substrate 1101 and a second substrate 1102, which are spaced apart from and parallel to each other and extend in the lengthwise direction, an input terminal 1210 formed on one end of the first substrate 1101 or the second substrate 1102, an output terminal 1220 formed on the other end of the first substrate 1101 or the second substrate 1102, n light emitting diode chips 1300 mounted above both the first substrate 1101 and the second substrate 1102 and arrayed in the lengthwise direction of the first substrate 1101 and the second substrate 1102, and connection means 1400 formed on the first substrate 1101 and the second substrate 1102 to connect the n light emitting diode chips 1300 in series. The connection means 1400 may be a metal film patterned by deposition or plating on the first substrate 1101 and the second substrate 1102. The input terminal 1210 and the output terminal 1220 may also be formed on the first substrate 1101 and/or the second substrate 1102 by deposition or plating for patterning.

The light emitting device 1000 further includes an elongated light transmitting encapsulant 1500 that simultaneously covers the light emitting diode chips 1300 and the first substrate 1101 and the second substrate 1102 above which the light emitting diode chips 1300 are mounted, while allowing exposure of outwardly extending terminals 1001 and 1002 protruding from one side of the first substrate 1101 and the other side of the second substrate 1102, respectively. The outwardly extending terminals 1001 and 1002 may be portions of the input terminal 1210 and the output terminal 1220 or may be connected to the input terminal 1210 and the output terminal 1220, respectively. The light transmitting encapsulant 1500 can serve to fix the first substrate 1101 to the second substrate 1102.

The light transmitting encapsulant 1500 may be formed by molding a transparent resin and may include a wavelength conversion material, for example, a fluorescent material, that acts in concert with at least some of the light emitting diode chips 1300, particularly blue light emitting diode chips 1300, to produce white light.

In this embodiment, the connection means 1400 formed on the first substrate 1101 and the second substrate 1102 is conductive. The connection means 1400 includes a first connection portion 1401 formed on the first substrate 1101 to connect the input terminal 1210 to an input end 1320 of the first light emitting diode chip 1301, a second connection portion 1402 formed on the second substrate 1102 and spaced apart from the first connection portion 1401 to connect an output end 1340 of the first light emitting diode chip 1301 to an input end 1320 of the second light emitting diode chip 1302, an $(n+1)^{th}$ connection portion 140n+1 formed on the second substrate 1102 to connect the output terminal 1220 to an output end 1340 of the $n^{th}$ light emitting diode chip 130n, and an $n^{th}$ connection portion 140n formed on the first substrate 1101, spaced apart from the $(n+1)^{th}$ connection portion 140n+1, and connected to an input end 1320 of the $n^{th}$ light emitting diode chip 130n. The connection means 1400 includes intermediate connection portions 1403, . . . , each of which connects the two adjacent light emitting diode chips 1300. The adjacent connection portions 1403 are formed alternately on the first substrate 1101 and the second substrate 1102 and are spaced apart from each other.

All connection portions, including the first, second, $n^{th}$, and $(n+1)^{th}$ connection portions (these portions are collectively denoted by numeral "1403"), are spaced apart from each other and are arranged in a zigzag pattern alternately on the first substrate 1101 and the second substrate 1102.

The first substrate 1101 and the second substrate 1102 are spaced apart from and parallel to each other to form gaps therebetween. The gaps are light transmitting regions through which light enters and exits. Each of the first substrate 1101 and the second substrate 1102 has flat upper and lower surfaces and is elongated.

In this embodiment, the input terminal 1210 is formed on the upper surface of one end of the first substrate 1101 and is made of a conductive metal material. The output terminal 1220 is formed on the upper surface of the other end of the second substrate 1102 and is made of a conductive metal material. In this embodiment, the input terminal 1210 and the output terminal 1220 are formed on the different substrates, i.e. the first substrate 1101 and the second substrate 1202, due to the use of the predetermined number (n) of the light emitting diode chips. If the number of the light emitting diode chips increased to n+1 or decreased to n−1, both the input terminal 1210 and the output terminal 1220 may be formed on any one of the first substrate 1101 and the second substrate 1202. That is, the locations of the input terminal 1210 and the output terminal 1220 are determined by the number of the light emitting diode chips.

The input terminal 1210 and the output terminal 1220 may be connected to the outwardly extending terminals 1001 and 1002 protruding outward from the first substrate 1101 and the second substrate 1102, respectively. The outwardly extending terminals 1001 and 1002 are connected to leads of external power supply means.

Before or after or simultaneously with the formation of the input terminal 1210 and the output terminal 1220, the connection means 1400 including a conductive metal film pattern, which includes a plurality of metal film islands, is provided on the first substrate 1101 and the second substrate 1102. The conductive metal film pattern constituting the connection means 1400 is formed by forming a conductive metal film over the entire surfaces of the first substrate 1101 and the second substrate 1102 and etching the conductive metal film through a mask or by arranging a patterned mask on the first substrate 1101 and the second substrate 1102 and forming a conductive metal film on the mask.

The n light emitting diode chips 1300 are arrayed in line along the lengthwise direction of the first substrate 1101 and the second substrate 1102 above both the first substrate 1101 and the second substrate 1102 between the input terminal 1210 and the output terminal 1220. The light emitting diode chips 1300 are flip bonding type light emitting diode chips whose input end 1320 and output end 1340 include electrode pads 1321 and 1341 and/or bumps 1322 and 1342, respectively, that extend toward the first substrate 1101 and the second substrate 1102.

The n light emitting diode chips 1300 are mounted above the first substrate 1101 and the second substrate 1102 by flip bonding. As a result of the mounting, the n light emitting diode chips 1300 are connected to the corresponding conductive transparent connection portions of the connection means 1400 formed using a conductive transparent film on the first substrate 1101 and the second substrate 1102 such that they are connected in series to form a circuit. In this embodiment, the conductive transparent connection portions 1401, 1402, 1403, . . . , 140n, and 140n+1 connect the input terminal to the first light emitting diode chip, the output terminal to the last light emitting diode chip, and the adjacent intermediate light emitting diode chips to each other. This connection eliminates the need for the use of bonding wires, unlike series circuit connection of conventional lateral type light emitting diode chips. Between the first substrate 1101 and the second substrate 1102, gaps exist through which light can be transmitted. Thus, despite their flip-chip type, the light emitting diode chips 1300 can emit light even in the backward direction. In order to increase the amount of light emitted backward from the light emitting diode chips 1300, it is preferred that the light emitting diode chips 1300 have a larger width in the transverse direction of the first substrate 1101 and the second substrate 1102 than in the lengthwise direction of the first substrate 1101 or the second substrate 1102. It is also preferred that the width of the gap between the first substrate 1101 and the second substrate 1102 is larger than the widths of the first substrate 1101 and the second substrate 1102.

Each of the light emitting diode chips 1300 includes a light transmitting substrate 1311, a first conductivity type semiconductor layer 1312, an active layer 1313, and a second conductivity type semiconductor layer 1314 in this order from top to bottom. A portion of the second conductivity type semiconductor layer 1314 is connected to the first electrode pad 1321. A portion of the first conductivity type semiconductor layer 1312 is opened by mesa etching and is connected to the second electrode pad 1341.

The first electrode pad 1321 and the second electrode pad 1341 are connected to the conductive transparent connection portion 1401, 1401, 1402, 1403, . . . , 140n or 140n+1 on the first substrate 1101 and/or the second substrate 1102 through the first bump 1322 and the second bump 1342, respectively.

Although not illustrated, the formation of an extension on each of the first electrode pad 1321 and the second electrode pad 1341 may be considered. The extension may be formed integrally with or separately from each of the first electrode pad 1321 and the second electrode pad 1341. Due to the formation of the extensions, the first electrode pad 1321 and the second electrode pad 1341 ensure reliable and easy connection to the first substrate 1101 and the second substrate 1102, respectively.

The addition of the extensions increases the contact areas of the first electrode pad 1321 and the second electrode pad 1341 with the first bump 1322 and the second bump 1342, respectively, resulting in larger contact areas of the first bump 1322 and the second bump 1342 with the first substrate 1101 and the second substrate 1102, respectively. An additional light transmitting material may be interposed between the first and second substrates 1101 and 1102 and the light emitting diode chips 1300 before formation of the encapsulant. In this case, stable contact may be achieved between the light emitting diode chips 1300 and the first and second substrates 1101 and 1102 without substantial interference with backward light emission from the light emitting diode chips 1300.

It is preferred that the input terminal 1210 includes a metal base material 1211 including at least one of Ag, Au, Cu, and Al and a reflective material film coated on the metal base material. Likewise, it is preferred that the output terminal 1220 includes a metal base material including at least one of Ag, Au, Cu, and Al and a reflective material film coated on the metal base material.

The light emitting device 1000 is fabricated by the following procedure. First, the first substrate 1101 and the second substrate 1102 or a base material including the first substrate and the second substrate are prepared. A metal or a conductive metal compound is deposited on the first substrate and the second substrate or the base material to form a conductive transparent film. Then, the conductive transparent film is etched to form the connection means 1400 including conductive transparent connection portions 1401, 1402, 1403, . . . , 140n, and 140n+1 on the first substrate 1101 and the second substrate 1102. Alternatively, the connection means 1400 including conductive transparent connection portions 1401, 1402, 1403, . . . , 140n, and 140n+1 may be formed by forming a patterned mask on the first substrate and the second substrate and depositing a conductive metal compound or a metal thereon. An E-beam or sputtering process may be used for the formation of the connection means 1400.

Next, the input terminal 1210 and the output terminal 1220 are arranged on the first substrate 1101 and the second substrate 1102, respectively, such that they are electrically connected in series with the light emitting diode chips 1300 through the conductive transparent connection portions 1401, 1402, 1403, . . . , 140$n$, and 140$n$+1.

With this arrangement, the input terminal 1210 is connected to the input end 1320 of the first light emitting diode chip 1301 through the first conductive transparent connection portion 1401, the output end 1340 of the first light emitting diode chip 1301 is connected to the input end 1320 of the second light emitting diode chip 1302 through the second conductive transparent connection portion 1402, the output terminal 1220 is connected to the output end 1340 of the n$^{th}$ light emitting diode chip 130$n$ through the (n+1)$^{th}$ conductive transparent connection portion 140$n$+1, and the n$^{th}$ conductive transparent connection portion 140$n$ is connected to the input end 1320 of the n$^{th}$ light emitting diode chip 130$n$. In addition, the other adjacent light emitting diode chips 1300 are connected to each other through the corresponding conductive transparent connection portions.

The two outwardly extending terminals 1001 and 1002 are connected to the input terminal 1210 and the output terminal 1220, respectively, and protrude from one side of the first substrate 1101 and the other side of the second substrate 1102, respectively. The light transmitting encapsulant 1500 is formed to surround the first substrate 1101, the second substrate 1102, and the light emitting diode chips 1300 by molding, completing the fabrication of the light emitting device 1000. Only the two outwardly extending terminals 1001 and 1002 are uncovered by the light transmitting encapsulant 1500 and are exposed to the outside. The light transmitting encapsulant 1500 may include a wavelength conversion material, i.e. a fluorescent material, capable of producing white light in concert with the diode chips 1300 emitting light at blue or ultraviolet wavelengths. At least one light emitting diode chip capable of emitting light in the wavelength range of 620-680 nm may be included in the light emitting diode chips 1300 to convert white light to warm white light.

Seventh Embodiment

Figure 14:
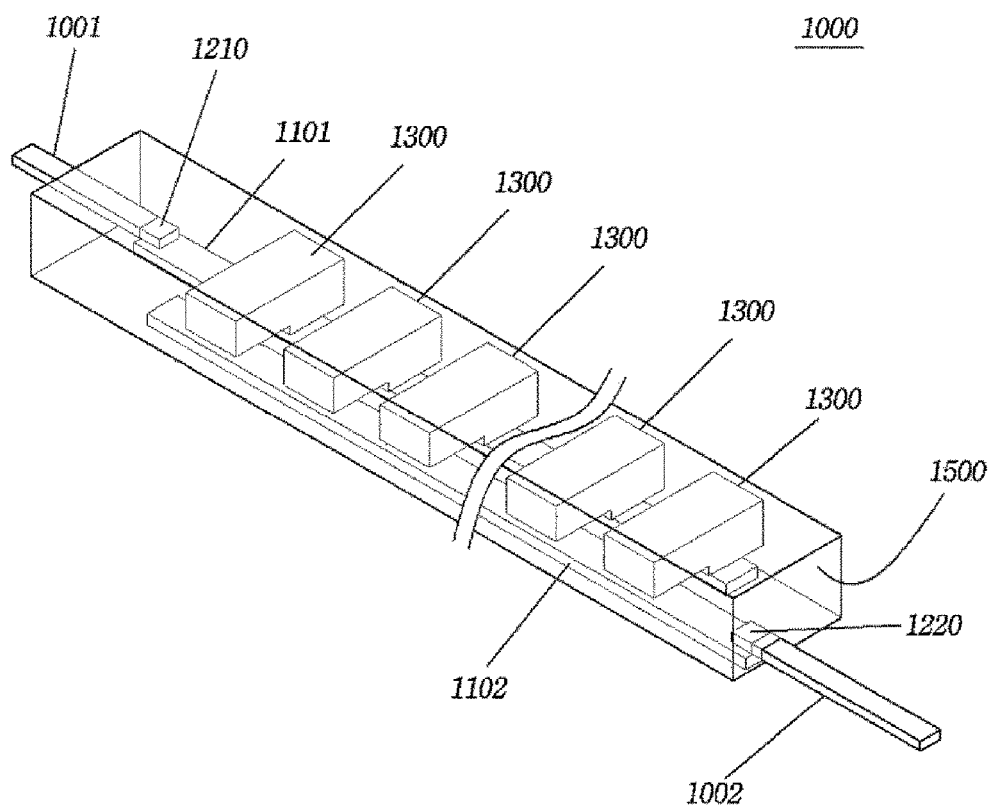
FIG. 14 is a perspective view illustrating a light emitting device according to a seventh embodiment of the present invention.
Figure 15:
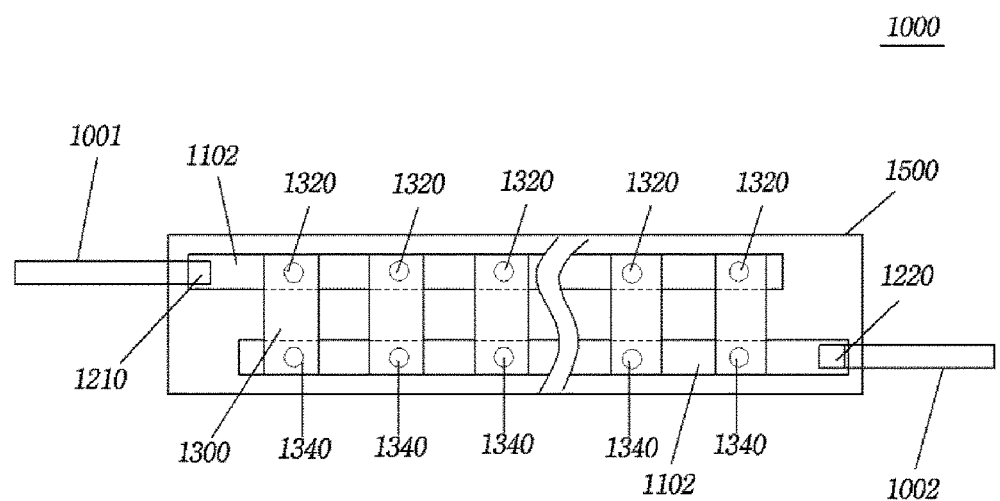
FIG. 15 is a plan view illustrating the light emitting device of FIG. 14.

FIGS. 14 and 15 are views for explaining a light emitting device according to a seventh embodiment of the present invention.

Referring to FIGS. 14 and 15, an elongated conductive electrode without interruption is provided on a first substrate 1101 and an elongated conductive electrode without interruption is provided on a second substrate 1102. The conductive electrodes are connection means for electrical connection of light emitting diode chips 1300. The first substrate 1101 may be in the form of a metal plate or may be made by forming an elongated linear conductive pattern without interruption on a non-conductive substrate. Likewise, the second substrate 1102 may be in the form of a metal plate or may be made by forming an elongated linear conductive pattern without interruption on a non-conductive substrate. Thus, the first substrate 1101 can act as a common electrode to which all input ends of the light emitting diode chips 1300 are connected and the second substrate 1102 can act as a common electrode to which all output ends of the light emitting diode chips 1300 are connected.

In this embodiment, each of the light emitting diode chips 1300 is a flip bonding type light emitting diode chip and includes an input end 1320 and an output end 1340 extending toward the non-conductive transparent substrate 1100. The light emitting diode chips 1300 are mounted above both the first substrate 1101 and the second substrate 1102 spaced apart from each other and are arrayed along the lengthwise direction of the first substrate 1101 and the second substrate 1102. The first substrate 1101 is formed as a first electrode connected to all input ends 1320 of the light emitting diode chips 1300 and the second substrate 1102 is formed as a second electrode connected to all output ends 1340 of the light emitting diode chips 1300. With this arrangement, the light emitting diode chips 1300 are connected in parallel.

The other elements are the same as or similar to those in the previous embodiments.

What is claimed is:

1. A light emitting device comprising:
   a non-conductive transparent substrate;
   one or more light emitting diode chips mounted on the upper surface of the non-conductive transparent substrate and each comprising input and output ends extending toward the non-conductive transparent substrate; and
   conductive transparent connection portions formed on the upper surface of the non-conductive transparent substrate and electrically connected to the input and output ends,
   wherein light transmitting regions are provided in the vicinity of the input and output ends between the non-conductive transparent substrate and the light emitting diode chips and light is emitted backward from the light emitting diode chips through the light transmitting regions and the non-conductive transparent substrate.

2. The light emitting device according to claim 1, wherein each of the input end and the output end comprises an electrode pad and a bump that extend toward the non-conductive transparent substrate.

3. The light emitting device according to claim 1, wherein the light transmitting regions are formed by filling an insulating transparent material in vacant spaces between the non-conductive transparent substrate and the light emitting diode chips.

4. The light emitting device according to claim 3, wherein the insulating transparent material comprises a fluorescent material.

5. The light emitting device according to claim 1, further comprising a light transmitting encapsulant encapsulating the non-conductive transparent substrate and the light emitting diode chips.

6. The light emitting device according to claim 1, wherein the one or more light emitting diode chips comprise n light emitting diode chips arrayed on the non-conductive transparent substrate and the n light emitting diode chips are connected in series through the conductive transparent connection portions on the non-conductive transparent substrate.

7. The light emitting device according to claim 1, wherein a metal electrode layer is interposed between each of the conductive transparent connection portion and a bump of the input end or a bump of the output end.

8. The light emitting device according to claim 1, wherein the amount of light emitted through the non-conductive transparent substrate is larger than that of light emitted in a direction opposite to the direction toward the non-conductive transparent substrate.

9. A light emitting device comprising:
an elongated non-conductive transparent substrate;
an input terminal arranged on one side of the non-conductive transparent substrate;
an output terminal arranged on the other side of the non-conductive transparent substrate;
n light emitting diode chips arrayed above the non-conductive transparent substrate and each having input and output ends; and
connection means formed on the non-conductive transparent substrate to connect the n light emitting diode chips in series,
wherein the connection means comprises a first connection portion that connects the input terminal to the input end of the first light emitting diode chip and is made of a conductive transparent material.

10. The light emitting device according to claim 9, wherein each of the input end and the output end comprises an electrode pad extending toward the non-conductive transparent substrate.

11. The light emitting device according to claim 9, wherein the connection means further comprises a second connection portion spaced apart from the first connection portion and connected to the output end of the first light emitting diode chip, and the second connection portion is made of a conductive transparent material.

12. The light emitting device according to claim 11, wherein the second connection portion is connected to the input end of the second light emitting diode chip.

13. The light emitting device according to claim 9, wherein the connection means comprises an $(n+1)^{th}$ connection portion connecting the output terminal to the output end of the $n^{th}$ light emitting diode chip, and the $(n+1)^{th}$ connection portion is made of a conductive transparent material.

14. The light emitting device according to claim 9, wherein the connection means further comprises an $n^{th}$ connection portion spaced apart from the $(n+1)^{th}$ connection portion and connected to the input end of the $n^{th}$ light emitting diode chip, and the $n^{th}$ connection portion is made of a conductive transparent material.

15. The light emitting device according to claim 9, wherein the connection means comprises connection portions connecting the adjacent light emitting diode chips and the connection portions are made of a conductive transparent material.

16. A light emitting device comprising:
an elongated first substrate;
an elongated second substrate spaced apart from and parallel to the first substrate;
connection means provided between the first substrate and the second substrate and made of a conductive material; and
n light emitting diode chips mounted on both the first substrate and the second substrate and electrically interconnected through input and output ends connected to the connection means,
wherein gaps are formed between the first substrate and the second substrate to allow light from the n light emitting diode chips to pass therethrough.

17. The light emitting device according to claim 16, further comprising a light transmitting encapsulant that covers the n light emitting diode chips, the first substrate, and the second substrate.

18. The light emitting device according to claim 16, further comprising an input terminal formed on one end of the first substrate and an output terminal formed on the other end of the first substrate or the second substrate.

19. The light emitting device according to claim 16, wherein the connection means is formed on the first substrate or the second substrate and comprises connection portions connecting the input and output ends of the adjacent light emitting diode chips.

20. The light emitting device according to claim 16, wherein the connection means comprises a first electrode made of a conductive material on the first substrate and to which all input ends of the n light emitting diode chips are connected and a second electrode made of a conductive material on the second substrate and to which all output ends of the n light emitting diode chips are connected.

* * * * *